US012051894B2

(12) United States Patent
Beckert et al.

(10) Patent No.: US 12,051,894 B2
(45) Date of Patent: Jul. 30, 2024

(54) DC VOLTAGE SWITCH

(71) Applicant: Siemens Aktiengesellschaft, Munich (DE)

(72) Inventors: Thomas Beckert, Nuremberg (DE); Jens Weidauer, Fuerth (DE)

(73) Assignee: Siemens Aktiengesellschaft, Munich (DE)

( * ) Notice: Subject to any disclaimer, the term of this patent is extended or adjusted under 35 U.S.C. 154(b) by 288 days.

(21) Appl. No.: 17/440,847

(22) PCT Filed: Mar. 11, 2020

(86) PCT No.: PCT/EP2020/056449
§ 371 (c)(1),
(2) Date: Sep. 20, 2021

(87) PCT Pub. No.: WO2020/193134
PCT Pub. Date: Oct. 1, 2020

(65) Prior Publication Data
US 2022/0149610 A1  May 12, 2022

(30) Foreign Application Priority Data
Mar. 22, 2019  (DE) ..................... 10 2019 203 983.9

(51) Int. Cl.
*H02H 3/08* (2006.01)
*H01H 9/54* (2006.01)
(Continued)

(52) U.S. Cl.
CPC ............ *H02H 3/087* (2013.01); *H01H 9/548* (2013.01); *H02H 3/066* (2013.01); *H02H 3/081* (2013.01);
(Continued)

(58) Field of Classification Search
CPC .......... H01H 9/54; H01H 9/548; H01H 33/59; H01H 33/596; H02H 3/066; H02H 3/081;
(Continued)

(56) References Cited

U.S. PATENT DOCUMENTS

| 2016/0226251 A1 | 8/2016 | Tenca et al. |
| 2017/0170654 A1 | 6/2017 | Minegishi et al. |
| 2021/0135664 A1 | 5/2021 | Rupp |

FOREIGN PATENT DOCUMENTS

| CN | 1586944 A | * | 3/2005 |
| DE | 102014012828 A1 | | 3/2016 |

(Continued)

OTHER PUBLICATIONS

PCT International Search Report and Written Opinion of International Searching Authority mailed Jul. 23, 2020 corresponding to PCT International Application No. PCT/EP2020/056449 filed Mar. 11, 2020.
(Continued)

*Primary Examiner* — Scott Bauer
(74) *Attorney, Agent, or Firm* — Harness, Dickey & Pierce, P.L.C.

(57) ABSTRACT

A DC voltage switch includes a semiconductor-based electronically controllable switching device, a sensor provided upstream of the switching device for determining the DC voltage bus-side voltage level, a sensor provided downstream of the switching device for determining the DC voltage branch-side voltage level, a current sensor for determining current level and direction, a control device designed such that the direction and level of the current are determined, the flow of current is interrupted by the switching device when a first threshold value of the current level is
(Continued)

exceeded, and when the first threshold value of the current level is exceeded in the reverse direction: the DC voltage bus-side voltage level is compared with the DC voltage branch-side voltage level, and the switching device is switched on upon a voltage difference being less than a voltage difference value.

20 Claims, 3 Drawing Sheets

(51) Int. Cl.
    *H02H 3/06*     (2006.01)
    *H02H 3/087*     (2006.01)
    *H03K 17/567*     (2006.01)
    *H03K 17/51*     (2006.01)

(52) U.S. Cl.
    CPC ..... *H03K 17/567* (2013.01); *H03K 2017/515* (2013.01)

(58) Field of Classification Search
    CPC .......... H02H 3/087; H02H 7/26; H02H 7/268; H03K 17/08; H03K 17/16; H03K 17/081; H03K 17/73; H03K 17/168; H03K 17/567
    See application file for complete search history.

(56) References Cited

FOREIGN PATENT DOCUMENTS

| | | | |
|---|---|---|---|
| EP | 3051646 A1 | 8/2016 | |
| WO | WO-2014139559 A1 * | 9/2014 | ....... H03K 17/08148 |
| WO | WO 2014139559 A1 | 9/2014 | |
| WO | WO 2017220443 A1 | 12/2017 | |
| WO | WO 2018158233 A1 | 9/2018 | |

OTHER PUBLICATIONS

German Office Action dated Jan. 23, 2020.

* cited by examiner

DC VOLTAGE SWITCH

PRIORITY STATEMENT

This application is the national phase under 35 U.S.C. § 371 of PCT International Application No. PCT/EP2020/056449 which has an International filing date of Mar. 11, 2020, which claims priority to German patent application DE 10 2019 203 983.9 filed Mar. 22, 2019, the entire contents of each of which are hereby incorporated herein by reference.

FIELD

Embodiments of the present application generally relate to a DC voltage switch for coupling a DC voltage device or DC voltage branch having a positive conductor and a negative conductor to a DC voltage bus, and an associated method.

BACKGROUND

DC voltage is taken to mean voltages of up to 1500 volts. DC voltages up to this level are also referred to as low voltage. More specifically, DC voltage is taken to mean, in particular, voltages which are greater than the extra-low voltage having a level of 120 volts DC voltage. DC voltage is taken to mean voltages of 400-800 volts in particular.

A DC voltage circuit or DC circuit is taken to mean circuits for currents, in particular rated currents or maximum currents, of 2 to 1000 amperes; more specifically for currents of 2 amperes to 400 amperes or 200 amperes.

A DC voltage bus is taken to mean an at least two-conductor system having a positive conductor and a negative conductor, which system is supplied with DC voltage by at least one energy source. A (DC voltage) device, e.g. a DC voltage load, a load, an inverter, a combined energy sink or energy source, a pure (further) energy source, etc., is connected to the DC voltage bus via a DC voltage branch in each case. A plurality of DC voltage devices can also be connected to a DC voltage branch.

DC voltage device is taken to mean, in particular, a device having a power of 1 kilowatt to 500 kilowatts.

In the meantime, DC voltage circuits, also referred to as DC voltage networks or low-voltage DC networks, have been increasingly developed and constructed and usually comprise a DC voltage bus with DC voltage branches.

The DC voltage branches, also referred to as load branches, are usually projected by way of a DC voltage switch (DC switch). These DC voltage switches comprise a switching device.

A basic illustration of a DC voltage circuit, DC voltage network, low-voltage DC network or DC network with a DC voltage bus DCB and a plurality of DC voltage branches DCA1, DCA2, DCA3 with DC voltage switches S1, S2, S3 is shown in FIG. 1.

FIG. 1 shows in terms of basic principles a DC voltage source EQ connected to a DC voltage bus DCB via an infeed switch S4. A first DC voltage branch DCA1 with at least one first DC voltage device G1 is connected to the DC voltage bus DCB via a first DC voltage switch S1; in an analogous manner, a second DC voltage branch DCA2 with at least one second DC voltage device G2 is connected via a second DC voltage switch S2, and a third DC voltage branch DCA3 with at least one third DC voltage device G3 is connected via a third DC voltage switch S3.

Further DC voltage switches, DC voltage branches and DC voltage devices can be provided. The DC voltage switches can be outgoer switches. The DC voltage devices usually have an electrical capacitance that can store not inconsiderable amounts of energy.

If a fault occurs in the DC voltage circuit in accordance with FIG. 1, e.g. a short circuit in the first DC voltage branch DCA1 at the fault location F1, situated between first DC voltage switch S1 and first (DC voltage) device G1, then the short circuit there is fed from the energy source EQ and furthermore from the surrounding DC voltage branches, in the example the second and third DC voltage branches DCA2, DCA3, or respectively the energy sources or capacitances (of the devices) situated therein. This results in a high current in the associated switching device, in the example in the second or respectively third DC voltage switch S2, S3, which trips/can trip with a disconnection.

The second and third devices G2, G3 or the capacitances thereof supply a high (fault) current. If the second device G2, for example, has a low rated current, then the second DC voltage switch S2 has a correspondingly low rating and can interrupt the current flow even if the fault occurred in a different branch.

In principle, the surrounding DC voltage switches (S2, S3) are intended to impede the current flow from the respective DC voltage branch or load branch to the short circuit F1 as little as possible in order that the DC voltage switch, in the example the first DC voltage switch S1, reliably trips.

It is furthermore important here that the surrounding DC voltage switches (S2, S3) do not trip, with the result that so-called selected disconnection of the fault (by S1) takes place.

This is not always ensured, as explained above. Particularly if the surrounding DC voltage switches comprise switching devices having semiconductor switching elements. The semiconductor switching elements usually have a saturation current that is lower than the short-circuit current in the case of a fault, and thus have a current-limiting effect. Moreover, the saturation current can be carried by the semiconductor switching element only for a short time, usually in the single-digit µs range. Therefore, in order to protect the semiconductor switching element, the DC voltage switches have to switch off (self-protective failsafe), i.e. interrupt the current flow, without taking account of the required selectivity.

This problem has hitherto been solved by the DC voltage switches either comprising electromechanical switching devices or having been greatly overdimensioned, which is expensive or uneconomic.

SUMMARY

At least one embodiment of the present invention improves the switching behavior of DC voltage switches for achieving selectivity, in particular to specify a solution to the stated problem for DC voltage switches comprising semiconductor-based switching devices.

At least one embodiment is directed to a DC voltage switch or a method.

At least one embodiment of the invention proposes a DC voltage switch for coupling a DC voltage branch to a DC voltage bus, the DC voltage branch being provided for at least one DC voltage device and having a positive conductor and a negative conductor, wherein a forward direction of the electric current is defined by a current flow from the positive conductor of the DC voltage bus DCB via the DC voltage switch to the positive conductor of the DC voltage branch and from the negative conductor of the DC voltage branch via the DC voltage switch to the negative conductor of the DC voltage bus.

At least one embodiment of the invention proposes a DC voltage switch comprising:

- a semiconductor-based, electronically controllable switching device,
- a DC voltage bus-side voltage sensor provided upstream of the switching device, for determining the DC voltage bus-side voltage level,
- a DC voltage branch-side voltage sensor provided downstream of the switching device, for determining the DC voltage branch-side voltage level,
- a current sensor for determining the current level and the current direction, and
- a control device connected to the switching device, the voltage sensors and the current sensor.

In one advantageous configuration of an embodiment of the invention, the switching device comprises at least one, in particular two, semiconductor switching element(s) carrying the positive or negative conductor-side current flow.

BRIEF DESCRIPTION OF THE DRAWINGS

The described properties, features and advantages of this invention and the way in which they are achieved will become clearer and more clearly understood in association with the following description of the example embodiments which are explained in greater detail in association with the drawing.

In the associated drawing.

DETAILED DESCRIPTION OF THE EXAMPLE EMBODIMENTS

Figure 1:
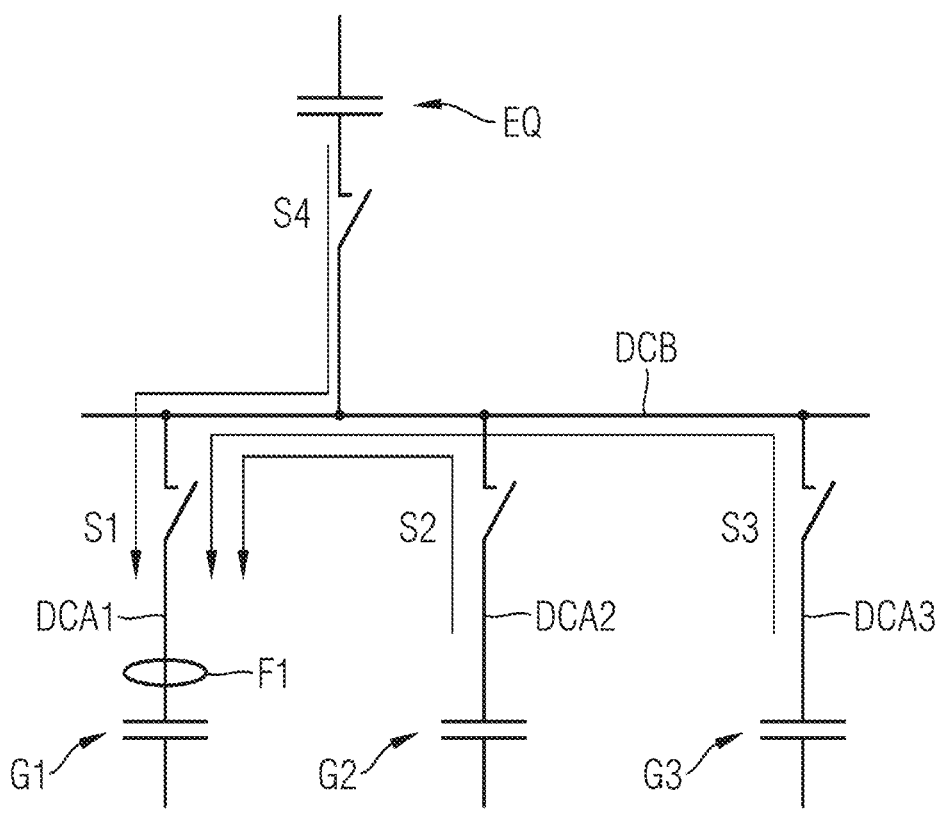
FIG. 1 shows a basic illustration of a DC voltage circuit with a DC voltage bus and a plurality of DC voltage branches with DC voltage switches.

At least one embodiment of the invention proposes a DC voltage switch for coupling a DC voltage branch to a DC voltage bus, the DC voltage branch being provided for at least one DC voltage device and having a positive conductor and a negative conductor, wherein a forward direction of the electric current is defined by a current flow from the positive conductor of the DC voltage bus DCB via the DC voltage switch to the positive conductor of the DC voltage branch and from the negative conductor of the DC voltage branch via the DC voltage switch to the negative conductor of the DC voltage bus.

A reverse direction of the electric current is thus defined from the positive conductor of the DC voltage branch via the DC voltage switch to the positive conductor of the DC voltage bus and from the negative conductor of the DC voltage bus via the DC voltage switch to the negative conductor of the DC voltage branch.

At least one embodiment of the invention proposes a DC voltage switch comprising:

- a semiconductor-based, electronically controllable switching device,
- a DC voltage bus-side voltage sensor provided upstream of the switching device, for determining the DC voltage bus-side voltage level,
- a DC voltage branch-side voltage sensor provided downstream of the switching device, for determining the DC voltage branch-side voltage level,
- a current sensor for determining the current level and the current direction, and
- a control device connected to the switching device, the voltage sensors and the current sensor.

The control device is configured in such a way that the direction of the current and the current level are determined; the direction and current level being determined periodically, in particular, in the event of a first threshold value (current threshold value) of the current level being exceeded, the current flow through the switching device is interrupted, with the reverse direction being present, in the event of the first threshold value of the current level being exceeded:

after interruption of the current flow, the DC voltage bus-side voltage level is compared with the DC voltage branch-side voltage level and the switching device is switched into the on state in the event of a voltage difference that is less than a voltage difference value.

This has the advantage that in the event of an inadvertent disconnection of the DC voltage switch in the event of an excessively high current flow, a reconnection is effected if the current (current level) resulting in the disconnection did not flow to the DC voltage device, but rather from the DC voltage device to the DC voltage bus. That is to say that a fault is not present in the DC voltage branch of the DC voltage switch, but rather on the part of the DC voltage bus or some other DC voltage branch. Furthermore if the voltage level on the DC voltage bus again corresponds to a value which corresponds approximately to voltage level in the DC voltage branch. In such a case, it can be assumed that a faulty branch was disconnected and the voltage on the DC voltage bus has returned to normal, such that fault-free DC voltage branches that inadvertently had to be disconnected continue to be supplied as intended.

Advantageous configurations of embodiments of the invention are specified in the claims.

In one advantageous configuration of an embodiment of the invention, the switching device comprises at least one, in particular two, semiconductor switching element(s) carrying the positive or negative conductor-side current flow.

This has the particular advantage of affording a particularly simple solution for a switching device.

In one advantageous configuration of an embodiment of the invention, the semiconductor switching element is an insulated gate bipolar transistor, a metal oxide semiconductor field effect transistor or a gallium nitride transistor.

This has the particular advantage of affording a simple solution for the semiconductor switching elements of the switching module.

In one advantageous configuration of an embodiment of the invention, a diode is connected in parallel with the semiconductor switching element, in particular with the forward direction of the diode counter to the forward direction of the semiconductor switching element.

This has the particular advantage of affording a simple solution for unidirectional semiconductor switching elements, in particular in the case where two unidirectional semiconductor switching elements are connected in series.

In one advantageous configuration of an embodiment of the invention, the diode has a low forward voltage, and in particular is a network diode or a Schottky diode.

This has the particular advantage that a particularly small voltage drop is present in the reverse direction, thus resulting firstly in a low power loss and secondly in a maximum current in the reverse direction in order to increase the selectivity.

In one advantageous configuration of an embodiment of the invention, the DC voltage switch is arranged in a housing.

This has the particular advantage that a compact DC voltage switch in a housing is available.

In one advantageous configuration of an embodiment of the invention, the housing has a positive conductor input connection, a negative conductor input connection, a positive conductor output connection and a negative conductor output connection. The input connections are connectable to the DC voltage bus. The output connections are connectable to the DC voltage branch.

The switching device connects the positive conductor input connection to the positive conductor output connection or the switching device connects the negative conductor input connection to the negative conductor output connection.

In one variant, switching devices can be provided in the positive and negative conductors.

This has the particular advantage that a simple solution for a compact DC voltage switch is available.

In one advantageous configuration of an embodiment of the invention, the connections not having the switching device are connected to one another by an electrical line.

This has the particular advantage of providing a simple solution, in particular solution with one-pole switching, for a DC voltage switch.

In one advantageous configuration of an embodiment of the invention, the voltage difference value is 10 volts.

This has the particular advantage that excessively high compensation currents between the DC voltage branch and DC voltage bus are minimized or the voltage difference exceeds a high measure.

In one advantageous configuration of an embodiment of the invention, the current sensor is a Hall effect-based sensor.

This has the particular advantage of affording a simple solution for determining the level and direction of the current.

In one advantageous configuration of an embodiment of the invention, the control device is furthermore configured in such a way that in the event of a rise in the current that exceeds a current rise threshold value, the current flow through the switching device is interrupted.

This has the particular advantage of affording a further protection criterion of the DC voltage switch for targeted tripping or the self-protective failsafe.

In one advantageous configuration of the invention, a power supply unit, an energy store or a connection for an external energy supply for the control device is provided.

This has the particular advantage that in particular an energy supply is provided after the tripping of the DC voltage switch.

In one advantageous configuration of an embodiment of the invention, the control device comprises a microprocessor.

This has the particular advantage of enabling a particularly convenient or changeable control of the DC voltage switch.

All configurations, both in dependent form and referring back merely to individual features or combinations of features of patent claims, bring about an improvement of a DC voltage switch for improving the selectivity in a DC voltage network. As a result, in particular devices of different performance classes can be operated on a common DC voltage bus.

FIG. 1 shows a basic illustration of a DC voltage circuit with a DC voltage bus and a plurality of DC voltage branches with DC voltage switches in accordance with the prior art, such as has already been described in the introduction.

Figure 2:
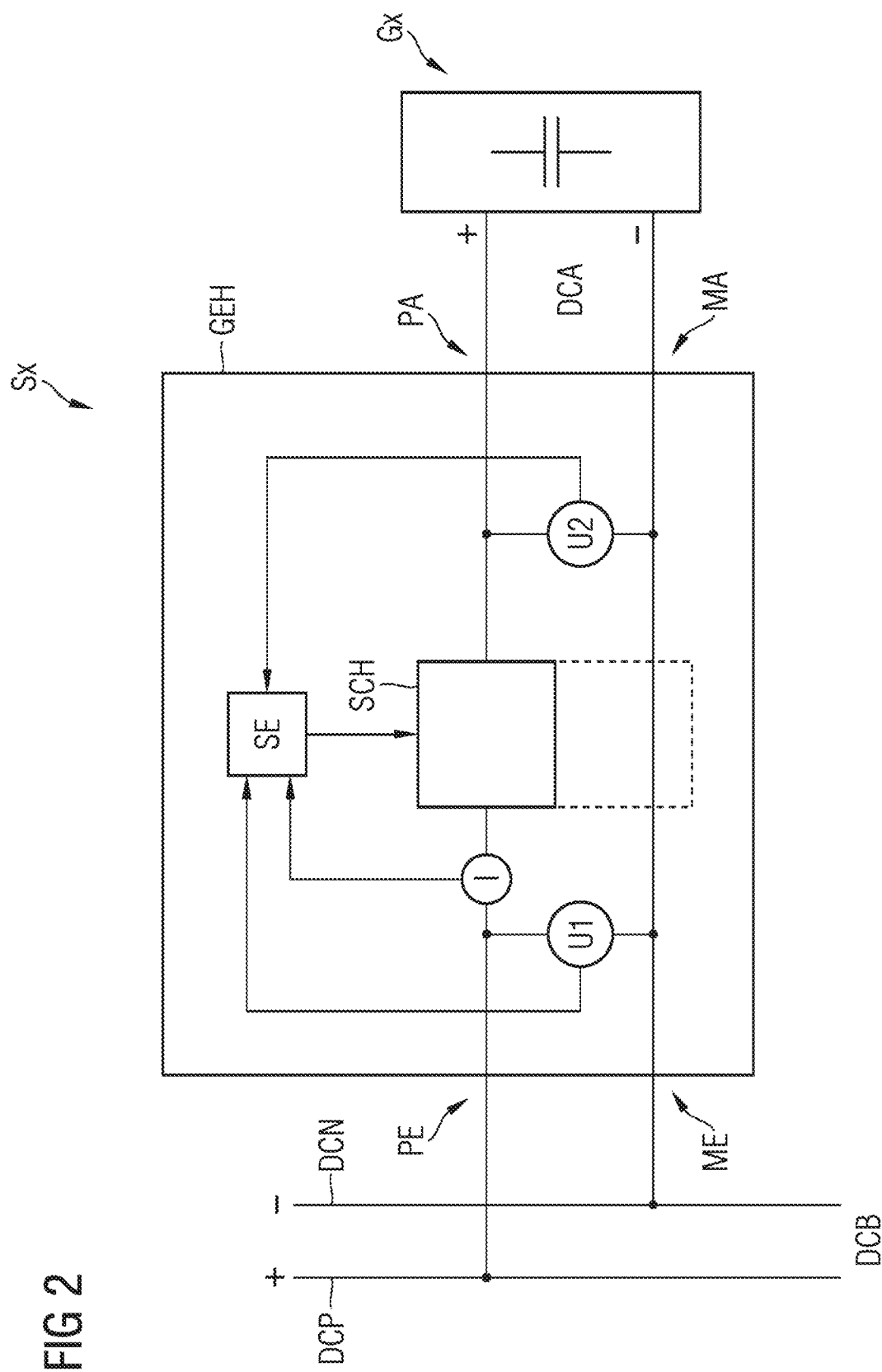
FIG. 2 shows an illustration of a DC voltage switch with DC voltage bus, DC voltage branch and DC voltage device according to an embodiment of the invention.

FIG. 2 shows a DC voltage switch Sx such as could be used for example as first, second or third switch S1, S2, S3 in accordance with FIG. 1, with a housing GEH. The housing GEH has a positive conductor input connection PE, a negative conductor input connection ME, a positive conductor output connection PA and a negative conductor output connection MA.

The input connections PE, ME are connected to the DC voltage bus DCB, which has a positive conductor DCP (+) and a negative conductor DCN (−).

The output connections PA, MA are connected to a DC voltage branch DCA, which is in turn connected to at least one DC voltage device Gx, for example a first, second or third device G1, G2, G3 in accordance with FIG. 1.

The DC voltage switch Sx comprises a switching device SCH.

Internally in the housing, the switching device SCH connects either the positive conductor input connection PE to the positive conductor output connection PA, as illustrated, or the negative conductor input connection ME to the negative conductor output connection MA.

Alternatively, two switching devices, a first and a second switching device, can also be provided, wherein the first switching device is provided for the positive conductor connections and the second switching device is provided for the negative conductor connections.

In accordance with FIG. 2, the connections not having the switching device SCH are connected to one another by an electrical line; in the example, the negative conductor input connection ME is connected to the negative conductor output connection MA by the electrical line.

Upstream of the switching device SCH, i.e. on the part of the DC voltage bus DCB, a DC voltage bus-side voltage sensor U1 is provided between the positive and negative conductors, for determining the DC voltage bus-side voltage level.

Downstream of the switching device SCH, i.e. on the part of the DC voltage branch DCA, a DC voltage branch-side voltage sensor U2 is provided between the positive and negative conductors, for determining the DC voltage branch-side voltage level.

A current sensor I for determining the current level and the current direction is provided in the positive conductor or negative conductor, upstream or downstream of the switching device SCH. The current sensor can be a Hall effect-based sensor.

The switching device SCH is a semiconductor-based, electronically controllable switching device SCH. It can comprise at least one semiconductor switching element carrying the current flow (on the positive or negative conductor side depending on position). In particular, two semiconductor switching elements carrying the current flow (on the positive or negative conductor side depending on position) can be provided. The semiconductor switching element can be an insulated gate bipolar transistor, a metal oxide semiconductor field effect transistor or a gallium nitride transistor.

A diode can be connected in parallel with the semiconductor switching element, in particular with the forward direction of the diode counter to the forward direction of the semiconductor switching element. The diode can have a low forward voltage, and in particular can be a network diode or a Schottky diode.

A control device SE is provided, which is connected to the switching device SCH, the voltage sensors U1, U2 and the current sensor I. The control device SE can comprise a microprocessor.

The control device can be supplied with energy by a power supply unit (not illustrated). The power supply unit can be connected to the DC voltage bus-side input connections or/and DC voltage branch-side output connections.

Alternatively or additionally, an energy storage device, such as a supercapacitor, a rechargeable battery or a battery, can be provided, for supplying energy to the control device SE for the case of tripping or the case of a short circuit/fault on a DC voltage branch DCA1, DCA2, DCA3 or the DC voltage bus DCB. Alternatively, provision can be made of a connection for an external energy supply for the control device and optionally further devices of the DC voltage switch Sx.

The control device is configured in such a way that
(in particular periodically) the direction of the current and the current level are determined,
in the event of a first threshold value of the current level, i.e. a current threshold value, being exceeded, the current flow through the switching device SCH is interrupted,
with the reverse direction of the current being present, shortly before or during the exceedance of the first threshold value of the current level:
after interruption of the current flow, the DC voltage bus-side voltage level is compared (periodically) with the DC voltage branch-side voltage level and the switching device is switched into the on state in the event of a voltage difference that is less than a voltage difference value. By way of example, the voltage difference value can be 10 volts. That is to say that if the voltage difference between DC voltage bus DCB and DC voltage branch DCA is less than 10 volts, the switching device SCH is reconnected by the control device SE, and the switching device SCH becomes conductive for the electric current flow.

In addition, the control device SE can furthermore be configured in such a way that in the event of a rise in the current that exceeds a current rise threshold value, the current flow through the switching device is interrupted. After an interruption of this type, too, the invention can be used and in the event of current flow in the reverse direction at the time of tripping/current interruption, a comparison of the voltages and, if appropriate, switch-on can be effected.

In the positive conductor or negative conductor, upstream or downstream of the switching device SCH, isolating contacts or an isolating switch can furthermore be provided in one or both conductors (positive and negative conductors), for the galvanic isolation of the DC voltage device or DC voltage switch. The isolating contacts can be switchable by the control device SE.

Figure 3:
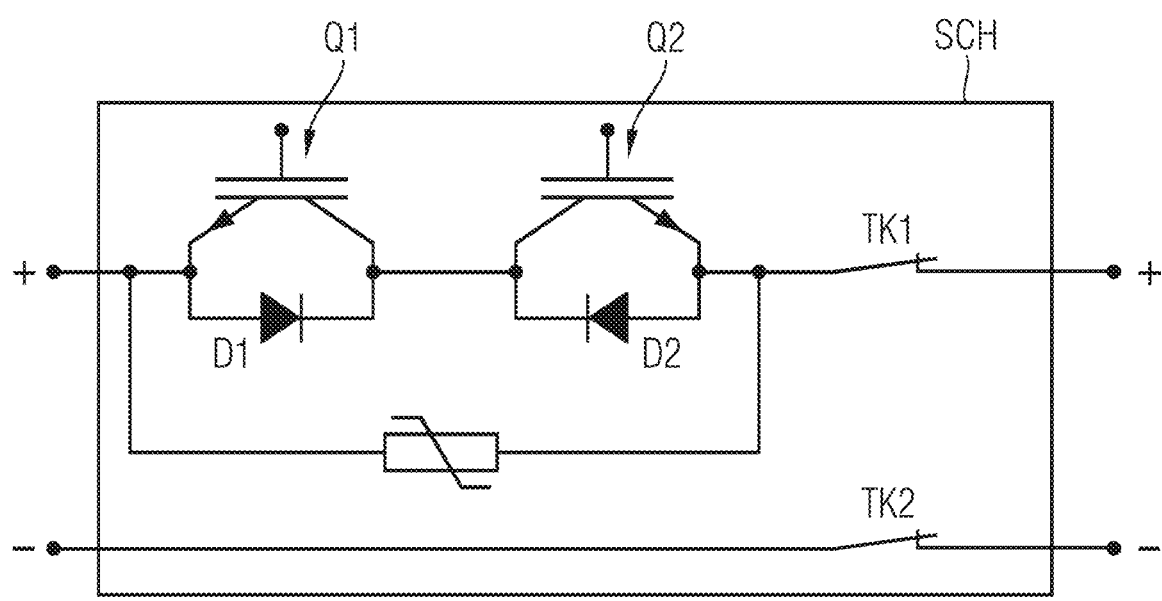
FIG. 3 shows one example of a switching device comprising semiconductor switching elements.

FIG. 3 shows one example of a switching device SCH comprising semiconductor switching elements. The switching device SCH has a series circuit comprising a first and a second semiconductor switching element Q1, Q2. The first controllable semiconductor switching element Q1 is conductive for a first current direction, for example, and the second controllable semiconductor switching element Q2 for the opposite current direction.

A first diode D1 is connected in parallel with the first semiconductor switching element Q1, the first diode being conductive in the opposite current direction to the first semiconductor switching element Q1, and a second diode D2 is connected in parallel with the second semiconductor switching element Q2, the second diode being conductive in the first current direction of the first semiconductor switching element Q1.

The switching device SCH is embodied with two-pole connections (for positive and negative conductors); in the example, the first and second semiconductor switching elements Q1, Q2 are situated in one conductor, in the positive conductor in the example; the negative conductor is fed through and has no semiconductor switching elements.

Alternatively, the semiconductor switching elements can also be arranged in the negative conductor or both conductors can have semiconductor switching elements.

The series circuit comprising the two semiconductor switching elements Q1, Q2 is followed by an isolating contact on the device side or on the DC voltage branch side, wherein a first isolating contact TK1 is provided for the positive conductor and a second isolating contact TK2 is provided for the negative conductor, generally referred to as isolating contact or isolating contacts, for the galvanic isolation of the DC voltage branch or device.

The switching device SCH can also be constructed differently, for example by two semiconductor switching elements Q1, Q2 being connected in parallel, wherein a diode can be connected in series with each of the semiconductor switching elements Q1, Q2 and this series circuit is connected in parallel. Other variants are likewise conceivable.

An embodiment of the invention will be explained again hereinafter in different words.

In DC voltage networks with distributed capacitances in the load outgoers and infeed paths, the protection of machines and operating equipment may in future be realized by power electronic DC voltage switches (switches). Selectivity of the switches is expected here. Selectivity requires, then, that (permanently) only the defective branch is disconnected and all other branches remain active.

Semiconductor-based switching elements such as Si IGBTs or SiC MOSFETS attain a saturation current that is less than the short-circuit currents in the case of a fault. Since these switching elements can carry such a saturation current only for a short time (in the µs range), these switches must switch off for a self-protective failsafe, without taking account of the required selectivity in such a DC voltage system.

An embodiment of the invention proposes two possibilities for realizing the selectivity:
A: Evaluating the short-circuit current and voltage before disconnection of the switch,
B: Evaluation of the voltage after disconnection of the switch and, if appropriate, rapid reconnection.

In DC voltage networks with distributed capacitances and driving line inductances, bidirectional power electronic switches are intended to be used for the protection of the outgoers. These switches may exhibit a current and voltage measurement (not just via emitter-collector, but between the poles) for the self-protective failsafe. The variables of current, rate of current rise, voltage and rate of voltage change can thus be detected.

From the current direction, a DC voltage switch, such as an outgoer switch S1, can determine whether the fault occurred in its DC voltage branch or outgoer and it must switch off permanently, provided that the fault as such is reliably identified from current rise and voltage dip.

If a switch must be disconnected for the self-protective failsafe, the variables mentioned above can be detected and buffered for an evaluation by a microcontroller or controller in the switch. In this case, a control voltage that is still available is advantageously present for the operation of the switch.

For the second and third DC voltage switches S2, S3 in adjacent branches or outgoers of comparable or lower power, the current flow in the case of a fault is effected in the reverse direction, toward the DC voltage bus or toward the DC distribution, and, by way of the depth of the voltage dip (discharge of the capacitance in the outgoer) and a recovery voltage as a result of continued feeding paths and line inductances, the current flow can additionally determine a point in time for the reconnection, which will be in the milliseconds range/ms range.

$$U_s(t) = R_L \cdot I_s(t) + L_L (dI_s(t)/dt) - \int I_s(t)/C \, dt + U\text{fault}$$

If switches have to be disconnected for the self-protective failsafe, S2 and S3 can decide, based upon the current direction, to be reconnected as rapidly as possible. In this case, S4 would recognize a return of the DC voltage and, if it had been disconnected, could likewise be reconnected very rapidly. S1 would remain open on account of the short circuit and thus the state of low voltage at the outgoer.

An embodiment of the invention has the advantage that in comparison with protection via electromechanical circuit breakers, it is possible to ensure selectivity in capacitance-buffered DC voltage networks if power electronic switches, according to system-adapted criteria, are not disconnected or are reconnected and can continue to supply the non-faulty outgoers before the capacitances are completely discharged and the system has to be restarted.

In particular, not only the flowing current but also the voltage and the respective change thereof are taken into account for the criteria. Rapid disconnection and reconnection by power electronic switches is crucial for this.

An improved selectivity without overdimensioning of the semiconductor switches is advantageous.

Although the invention has been more specifically illustrated and described in detail by way of the example embodiment, nevertheless the invention is not restricted by the examples disclosed and other variations can be derived therefrom by the person skilled in the art, without departing from the scope of protection of the invention.

The invention claimed is:

1. A DC voltage switch for coupling a DC voltage branch to a DC voltage bus, the DC voltage branch being provided for at least one DC voltage device and including a positive conductor and a negative conductor, the DC voltage switch being arranged in a housing, wherein in a forward direction electric current flows from a positive conductor of the DC voltage bus via the DC voltage switch to the positive conductor of the DC voltage branch and from the negative conductor of the DC voltage branch via the DC voltage switch to a negative conductor of the DC voltage bus, and in a reverse direction the electric current flows from the positive conductor of the DC voltage branch via the DC voltage switch to the positive conductor of the DC voltage bus and from the negative conductor of the DC voltage bus via the DC voltage switch to the negative conductor of the DC voltage branch, the DC voltage switch comprising:
   a semiconductor-based, electronically controllable switching device;
   a DC voltage bus-side voltage sensor provided upstream of the semiconductor-based, electronically controllable switching device, to determine a DC voltage bus-side voltage level;
   a DC voltage branch-side voltage sensor provided downstream of the semiconductor-based, electronically controllable switching device, to determine a DC voltage branch-side voltage level;
   a current sensor to determine current level and current direction; and
   a control device connected to the semiconductor-based, electronically controllable switching device, the DC voltage bus-side voltage sensor, DC voltage branch-side voltage sensor and the current sensor, wherein the control device is configured to
      determine a direction of the current and a current level,
      interrupt, upon a first threshold value of the current level being exceeded, the current flow through the semiconductor-based, electronically controllable switching device, and
      with the reverse direction being present, upon the first threshold value of the current level being exceeded:
         compare, after interruption of the current flow, the DC voltage bus-side voltage level with the DC voltage branch-side voltage level, and
         switch the semiconductor-based, electronically controllable switching device into an on state upon a voltage difference determined during comparison, being less than a voltage difference value.

2. The DC voltage switch of claim 1, wherein the semiconductor-based, electronically controllable switching device includes at least one semiconductor switching element carrying the current flow between
   the positive conductors of the DC voltage bus and the DC voltage branch, or
   the negative conductors of the DC voltage bus and the DC voltage branch.

3. The DC voltage switch of claim 2, wherein the at least one semiconductor switching element is an insulated gate bipolar transistor, a metal oxide semiconductor field effect transistor or a gallium nitride transistor.

4. The DC voltage switch of claim 2, wherein a diode is connected in parallel with the at least one semiconductor switching element.

5. The DC voltage switch of claim 4, wherein the diode has a low forward voltage.

6. The DC voltage switch of claim 1,
   wherein the housing has a positive conductor input connection, a negative conductor input connection, a positive conductor output connection and a negative conductor output connection;
   wherein the input connections are connectable to the DC voltage bus;
   wherein the output connections are connectable to the DC voltage branch; and
   wherein either the semiconductor-based, electronically controllable switching device is provided between positive conductor input connection and positive conductor output connection or the semiconductor-based, electronically controllable switching device is provided between negative conductor input connection and negative conductor output connection.

7. The DC voltage switch of claim 6, wherein connections not having the semiconductor-based, electronically controllable switching device are connected to one another by an electrical line.

8. The DC voltage switch of claim 1, wherein the voltage difference value is 10 volts.

9. The DC voltage switch of claim 1, wherein the DC voltage switch is an outgoer switch or is used in an outgoer switch.

10. The DC voltage switch of claim 1, wherein the current sensor is a Hall effect-based sensor.

11. The DC voltage switch of claim 1, wherein the control device is furthermore configured to, upon a rise in the current exceeding a current rise threshold value, interrupt the current flow through the semiconductor-based, electronically controllable switching device.

12. The DC voltage switch of claim 1, wherein a power supply unit, an energy store or a connection for an external energy supply is provided for supplying energy to the control device.

13. The DC voltage switch of claim 1, wherein the control device includes a microprocessor.

14. A DC voltage branch, comprising:
the DC voltage switch of claim 1, wherein the DC voltage switch is connected to a DC voltage bus at one end and is connected to devices at another end.

15. The DC voltage switch of claim 2, wherein a diode is connected in parallel with the at least one semiconductor switching element with a forward direction of a diode counter to the forward direction of the at least one semiconductor switching element.

16. The DC voltage switch of claim 3, wherein a diode is connected in parallel with the at least one semiconductor switching element.

17. The DC voltage switch of claim 5, wherein the diode is a network diode or a Schottky diode.

18. A method for coupling a DC voltage branch to a DC voltage bus, the DC voltage branch being provided for at least one DC voltage device and including a positive conductor and a negative conductor; wherein in a forward direction, electric current flows from a positive conductor of the DC voltage bus via a DC voltage switch, with a switching device, to the positive conductor of the DC voltage branch and from the negative conductor of the DC voltage branch via the DC voltage switch to a negative conductor of the DC voltage bus, and in a reverse direction the electric current flows from the positive conductor of the DC voltage branch via the DC voltage switch to the positive conductor of the DC voltage bus and from the negative conductor of the DC voltage bus via the DC voltage switch to the negative conductor of the DC voltage branch, the DC voltage switch being arranged in a housing, the method comprising:
determining a DC voltage bus-side voltage level;
determining a DC voltage branch-side voltage level;
determining a current level and a current direction;
interrupting, upon a first threshold value of the current level being exceeded, current flow through the switching device;
comparing, with a reverse direction being present, upon the first threshold value of the current level being exceeded after interruption of the current flow, the DC voltage bus-side voltage level with the DC voltage branch-side voltage level; and
switching the switching device into an on state upon a voltage difference, determined from the comparing, being less than a voltage difference value.

19. A DC voltage switch for coupling a DC voltage branch to a DC voltage bus, the DC voltage branch being provided for at least one DC voltage device and including a positive conductor and a negative conductor, wherein in a forward direction electric current flows from a positive conductor of the DC voltage bus via the DC voltage switch to the positive conductor of the DC voltage branch and from the negative conductor of the DC voltage branch via the DC voltage switch to a negative conductor of the DC voltage bus, and in a reverse direction the electric current flows from the positive conductor of the DC voltage branch via the DC voltage switch to the positive conductor of the DC voltage bus and from the negative conductor of the DC voltage bus via the DC voltage switch to the negative conductor of the DC voltage branch, the DC voltage switch comprising:
a semiconductor-based, electronically controllable switching device;
a DC voltage bus-side voltage sensor provided upstream of the semiconductor-based, electronically controllable switching device, to determine a DC voltage bus-side voltage level;
a DC voltage branch-side voltage sensor provided downstream of the semiconductor-based, electronically controllable switching device, to determine a DC voltage branch-side voltage level;
a current sensor to determine current level and current direction, the current sensor being a Hall effect-based sensor; and
a control device connected to the semiconductor-based, electronically controllable switching device, the DC voltage bus-side voltage sensor, DC voltage branch-side voltage sensor and the current sensor, wherein the control device is configured to
determine a direction of the current and a current level,
interrupt, upon a first threshold value of the current level being exceeded, the current flow through the semiconductor-based, electronically controllable switching device, and
with the reverse direction being present, upon the first threshold value of the current level being exceeded:
compare, after interruption of the current flow, the DC voltage bus-side voltage level with the DC voltage branch-side voltage level, and
switch the semiconductor-based, electronically controllable switching device into an on state upon a voltage difference determined during comparison, being less than a voltage difference value.

20. The DC voltage switch of claim 19, wherein the semiconductor-based, electronically controllable switching device includes at least one semiconductor switching element carrying the current flow between
the positive conductors of the DC voltage bus and the DC voltage branch, or
the negative conductors of the DC voltage bus and the DC voltage branch.

* * * * *